United States Patent
Li et al.

(10) Patent No.: US 10,833,287 B2
(45) Date of Patent: Nov. 10, 2020

(54) FLEXIBLE DISPLAY DEVICE AND MANUFACTURING METHOD THEREOF

(71) Applicant: Kunshan New Flat Panel Display Technology Center Co., Ltd., Kunshan (CN)

(72) Inventors: Jiawei Li, Kunshan (CN); Weiwei Li, Kunshan (CN); Kun Hu, Kunshan (CN)

(73) Assignee: Kunshan New Flat Panel Display Technology Center Co., Ltd., Kunshan (CN)

(*) Notice: Subject to any disclaimer, the term of this patent is extended or adjusted under 35 U.S.C. 154(b) by 0 days.

(21) Appl. No.: 16/460,013

(22) Filed: Jul. 2, 2019

(65) Prior Publication Data

US 2019/0326548 A1    Oct. 24, 2019

Related U.S. Application Data (63) Continuation of application No. PCT/CN2018/091389, filed on Jun. 15, 2018.

(30) Foreign Application Priority Data

Dec. 29, 2017    (CN) .......................... 2017 1 1482311

(51) Int. Cl.
  *H01L 51/52*    (2006.01)
  *H01L 27/32*    (2006.01)
  *H01L 51/56*    (2006.01)
  *H01L 51/00*    (2006.01)

(52) U.S. Cl.
  CPC ...... *H01L 51/5225* (2013.01); *H01L 27/3246* (2013.01); *H01L 51/524* (2013.01); *H01L 51/56* (2013.01); *H01L 51/0097* (2013.01); *H01L 51/5246* (2013.01); *H01L 2251/5338* (2013.01)

(58) Field of Classification Search
  CPC ............. H01L 51/0097; H01L 51/5225; H01L 51/5228; H01L 51/524–525; H01L 2251/5338
  See application file for complete search history.

(56) References Cited

U.S. PATENT DOCUMENTS

| 9,312,504 B2 | 4/2016 | Cheng et al. |
| 2013/0119352 A1* | 5/2013 | Aurongzeb ......... H01L 51/5225 257/40 |
| 2016/0276617 A1 | 9/2016 | Qi et al. |

FOREIGN PATENT DOCUMENTS

| CN | 104216159 A | 12/2014 |
| CN | 104538558 A | 4/2015 |
| CN | 105789262 A | 7/2016 |
| JP | 1154287 A | 2/1999 |

(Continued)

OTHER PUBLICATIONS

Chinese Second Office Action for CN Application No. 201711482311.6 dated Aug. 15, 2019.

(Continued)

*Primary Examiner* — Daniel P Shook
(74) *Attorney, Agent, or Firm* — Rimon PC (57) ABSTRACT

A flexible display device includes: an organic light emitting layer for emitting light; a cathode electrode layer disposed on the organic light emitting layer; and a cavity region located between a plane where the cathode electrode layer is located and the organic light emitting layer.

14 Claims, 4 Drawing Sheets

(56) References Cited

FOREIGN PATENT DOCUMENTS

JP          2015002124  A      1/2015

OTHER PUBLICATIONS

International search report of PCT/CN2018/091389 dated Sep. 28, 2018.
Written Opinion of PCT/CN2018/091389 dated Sep. 28, 2018.
Taiwan First Office Action for Application No. 107123423 dated Jan. 15, 2019.
Chinese First Office Action for CN Application No. 201711482311.6 dated Mar. 15, 2019.

* cited by examiner

FLEXIBLE DISPLAY DEVICE AND MANUFACTURING METHOD THEREOF

CROSS-REFERENCE TO RELATED APPLICATIONS

This application is a continuation application of International Application No. PCT/CN2018/091389 filed on Jun. 15, 2018, which claims priority to Chinese patent application No. 201711482311.6 filed on Dec. 29, 2017. Both applications are incorporated herein by reference in their entireties.

TECHNICAL FIELD

The present application relates to the field of display technology, and particularly to a flexible display device and a manufacturing method thereof.

BACKGROUND

At present, a flexible display device is generally made of a multilayer structure. When the flexible display device is bent, failure of a layer is often caused by stress concentration.

SUMMARY

In view of the above, the embodiments of the present application provide a flexible display device and a manufacturing method thereof which solve the problems including easy peeling between a cathode electrode layer and an organic light emitting layer.

An embodiment of the present application provides a flexible display device, including an organic light emitting layer for emitting light; a cathode electrode layer disposed on the organic light emitting layer; and a cavity region located between a plane where the cathode electrode layer is located and the organic light emitting layer.

The cathode electrode layer includes a protrusion extending to the organic light emitting layer and electrically connected with the organic light emitting layer.

The cathode electrode layer includes a first cathode electrode portion and a second cathode electrode portion, the first cathode electrode portion and the second cathode electrode portion are superposed. The first cathode electrode portion is disposed on a surface of the organic light emitting layer, and the first cathode electrode portion includes a first protrusion as the protrusion extending to the second cathode electrode portion and electrically connected with the second cathode electrode portion. Alternatively, the first cathode electrode portion is disposed on a surface of the organic light emitting layer, and the second cathode electrode portion includes a second protrusion as the protrusion extending to the first cathode electrode portion and electrically connected with the first cathode electrode portion. Alternatively, the first cathode electrode portion is disposed on a surface of the organic light emitting layer, and the first cathode electrode portion includes a first protrusion as the protrusion extending to the second cathode electrode portion, the second cathode electrode portion includes a second protrusion extending to the first cathode electrode portion, and the first protrusion is electrically connected with the second protrusion.

A part of the first cathode electrode portion located on the surface of the organic light emitting layer has a width of 3 to 20 µm, and a thickness of the first cathode electrode portion is 20 nm.

The flexible display device includes a pixel defining layer surrounding the organic light emitting layer; an anode electrode layer located on a non-light emitting side of the organic light emitting layer; an encapsulating layer superposed on the surface of the cathode electrode layer away from the organic light emitting layer; and an adhesive material disposed between the cathode electrode layer and the pixel defining layer or between the encapsulating layer and the pixel defining layer.

The cathode electrode layer includes a region in partial contact with the pixel defining layer.

A surface of the pixel defining layer on a same side as the cathode electrode layer includes at least one groove or gap, and the adhesive material is filled in the at least one groove or gap.

An embodiment of the present application also provides a method for manufacturing a flexible display device, including: preparing a cathode electrode layer, a surface of the cathode electrode layer including a protrusion; and electrically connecting the surface of the cathode electrode layer including the protrusion with an organic light emitting layer to form a cavity region between a plane where the cathode electrode layer is located and the organic light emitting layer.

An embodiment of the present application also provides a method for manufacturing a flexible display device, including: preparing a first cathode electrode portion on a surface of the organic light emitting layer; and preparing a second cathode electrode portion, and electrically connecting the second cathode electrode portion with the first cathode electrode portion to form a cavity region between a plane where the second cathode electrode portion is located and the organic light emitting layer.

The first cathode electrode portion includes a first protrusion for electrically connecting with the second cathode electrode portion; or the second cathode electrode portion includes a second protrusion for electrically connecting with the first cathode electrode portion; or, the first cathode electrode portion includes a first protrusion for electrically connecting with the second cathode electrode portion; and the second cathode electrode portion includes a second protrusion for electrically connecting with the first cathode electrode portion.

Before preparing a first cathode electrode portion on a surface of an organic light emitting layer, the manufacturing method includes: providing or preparing a first substrate; preparing an anode electrode layer; preparing a pixel defining layer that exposes the anode electrode layer; and preparing the organic light emitting layer on the exposed anode electrode layer.

Before electrically connecting the second cathode electrode portion with the first cathode electrode portion, the manufacturing method includes: preparing an adhesive material on a surface of the pixel defining layer.

A surface of the pixel defining layer includes a groove or a gap; and before electrically connecting the second cathode electrode portion with the first cathode electrode portion, the manufacturing method includes: preparing an adhesive material in the groove or the gap.

After electrically connecting the second cathode electrode portion with the first cathode electrode portion, the manufacturing method includes: peeling off the first substrate.

The preparing a second cathode electrode portion includes: providing or preparing a second substrate; preparing an encapsulation layer on the second substrate; and preparing the second cathode electrode portion on the encapsulation layer.

After electrically connecting the second cathode electrode portion with the first cathode electrode portion, the manufacturing method includes: peeling off the second substrate.

The embodiments of the present application provide a flexible display device and a manufacturing method thereof. By providing the cavity region between the plane where the cathode electrode layer is located and the organic light emitting layer, when the flexible display device is bent, the cavity region can avoid transmission of bending stress and release the bending stress, thereby effectively preventing stress concentration of the cathode electrode layer and the organic light emitting layer, avoiding defects of the cathode electrode layer or the organic light emitting layer, such as cracking, peeling and so on, and improving reliability performance of the flexible display device.

DETAILED DESCRIPTION

Figure 1:
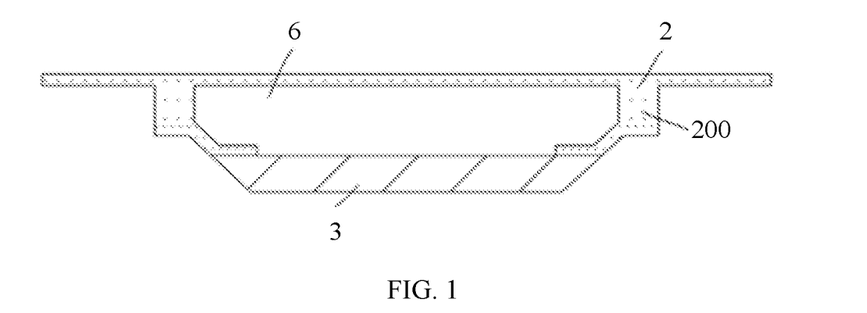
FIG. 1 shows a structural schematic diagram of a flexible display device according to an embodiment of the present application.

FIG. 1 shows a structural schematic diagram of a flexible display device according to an embodiment of the present application.

As shown in FIG. 1, the flexible display device includes an organic light emitting layer 3 for emitting light, a cathode electrode layer 2 disposed on a light emitting side of the organic light emitting layer 3, and a cavity region 6 located between a plane where the cathode electrode layer 2 is located and the organic light emitting layer 3. The plane where the cathode electrode layer 2 is located may be understood as a plane of preparing the cathode electrode layer 2 or a relatively flat plane of the cathode electrode layer 2. The organic light emitting layer 3 may correspond to light emitting pixels which emit a red light, a green light or a blue light, and the light emitting color type of the organic light emitting layer 3 is not specifically limited in the embodiments of the present application. The cathode electrode layer 2 may completely cover the organic light emitting layer 3, or may include a hollow structure on the surface to partially cover the organic light emitting layer 3. However, it should be understood that the cathode electrode layer 2 only need to have an electrical connection relationship with the organic light emitting layer 3, and can realize light emission of the flexible display device. The structural form of the cathode electrode layer 2 is not specifically limited in the embodiments of the present application.

By providing the cavity region 6 located between the plane where the cathode electrode layer 2 is located and the organic light emitting layer 3, when the flexible display device is bent, the cavity region 6 can avoid transmission of bending stress and release the bending stress, thereby effectively preventing stress concentration of the cathode electrode layer 2 and the organic light emitting layer 3, avoiding defects of the cathode electrode layer 2 or the organic light emitting layer 3, such as cracking, peeling and so on, and improving reliability performance of the flexible display device.

In an embodiment, the cathode electrode layer 2 includes a protrusion 200 extending to the organic light emitting layer 3 and abutting the organic light emitting layer. The protrusion 200 is electrically connected with the organic light emitting layer 3, so that a part of the cathode electrode layer 2 is away from the organic light emitting layer 3, and the cathode electrode layer 2 is not completely superposed on the organic light emitting layer 3, thereby forming a cavity region 6 located between the cathode electrode layer 2 and the organic light emitting layer 3. By providing the protrusion 200, preparation of the cavity region 6 can be facilitated. A volume of the cavity region 6 may be adjusted by adjusting a height of the protrusion 200, so that types of the cavity region 6 are enriched and diverse demands of actual production are meted.

Figure 2:
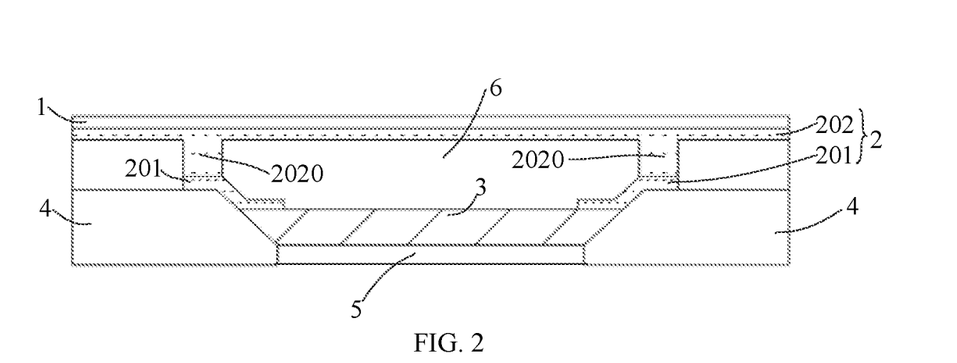
FIG. 2 shows a structural schematic diagram of a flexible display device according to an embodiment of the present application.

FIG. 2 shows a structural schematic diagram of a flexible display device according to an embodiment of the present application.

Referring to FIG. 2, in an embodiment, a cathode electrode layer 2 may be a structure in which a plurality of layers are electrically connected. For example, in the embodiment of the present application, the cathode electrode layer 2 includes a first cathode electrode portion 201 and a second cathode electrode portion 202, the first cathode electrode portion 201 and the second cathode electrode portion 202 are superposed with each other. The first cathode electrode portion 201 is disposed on a surface of the organic light emitting layer 3, and the first cathode electrode portion 201 may include a first protrusion (not shown in FIG. 2) extending to the second cathode electrode portion 202 and electrically connected with the second cathode electrode portion 202. Or, the first cathode electrode portion 201 is disposed on a surface of the organic light emitting layer 3, and the second cathode electrode portion 202 includes a second protrusion 2020 extending to the first cathode electrode portion 201 and electrically connected with the first cathode electrode portion 201. Or, the first cathode electrode portion 201 is disposed on a surface of the organic light emitting layer 3, the first cathode electrode portion 201 includes a first protrusion extending to the second cathode electrode portion 202, the second cathode electrode portion 202 includes a second protrusion 2020 extending to the first cathode electrode portion 201, and the first protrusion of the first cathode electrode portion 201 is electrically connected with the second protrusion 2020 of the second cathode electrode portion 202. Preferably, the first cathode electrode portion 201 is disposed at the edge of the organic light emitting layer 3, which reduces the occlusion of the organic light emitting layer 3 by the first cathode electrode portion 201, thereby avoiding affecting the display effect of the flexible display device. The cathode electrode layer 2 is divided into the first cathode electrode portion 201 and the second cathode electrode portion 202, the first cathode electrode portion 201 and the second cathode electrode portion 202 are electrically connected with each other, and the second cathode electrode portion 202 and the organic light emitting layer 3 may not be in contact with each other, which facilitates the fitting of the cathode electrode layer 2 and the organic light emitting layer 3, and reduces the difficulty in completely fitting the cathode electrode layer 2 and the organic light emitting layer 3.

In an embodiment, the surfaces of the electrical connection position of the first cathode electrode portion 201 and the second cathode electrode portion 202 are flat and have a same shape. For example, at the electrical connection position, if the surface of the first cathode electrode portion 201 is rectangular, the surface of the second cathode electrode portion 202 is also rectangular. In this way, good contact between the first cathode electrode portion 201 and the second cathode electrode portion 202 can be ensured. However, it should be understood that the electrical connection surfaces of the first cathode electrode portion 201 and the second cathode electrode portion 202 may also not be flat, as long as the first cathode electrode portion 201 and the second cathode electrode portion 202 are in contact with each other. The shape of the electrical connection surface of the first cathode electrode portion 201 and the second cathode electrode portion 202 may also be circle or other shape, and the shape of the electrical connection surface of the first cathode electrode portion 201 and the second cathode electrode portion 202 is not specifically limited in the embodiments of the present application.

In an embodiment, the flexible display device may further include a pixel defining layer 4 surrounding the organic light emitting layer 3, and an anode electrode layer 5 located on a non-light emitting side of the organic light emitting layer 3. When a voltage is applied to the flexible display device, holes output from the anode electrode layer 5 are combined with electrons output from the cathode electrode layer 2 on the organic light emitting layer 3, so that an organic light emitting device can emit light. Since the organic light emitting layer 3 is generally prepared by a vapor deposition method, a boundary of the organic light emitting layer 3 can be defined in advance by providing the pixel defining layer 4, thereby facilitating preparation of the organic light emitting layer 3.

In an embodiment, the cathode electrode layer 2 may cover a part of the pixel limiting layer 4. As shown in FIG. 2, the cathode electrode layer 2 may include a region in partial contact with the pixel defining layer 4, and the region covers a part of the surface of the pixel defining layer 4. The cathode electrode layer 2 may also include a region in which the cathode electrode layer 2 covers a part of the pixel defining layer 4 but is not in contact with the pixel defining layer 4. The cathode electrode layer 2 can ensure good conduction between a lower cathode electrode layer 2 and an upper cathode electrode layer 2 when the cathode electrode layer 2 is a multi-layer electrically connected structure by providing the region in partial contact with the pixel defining layer 4.

Figure 3:
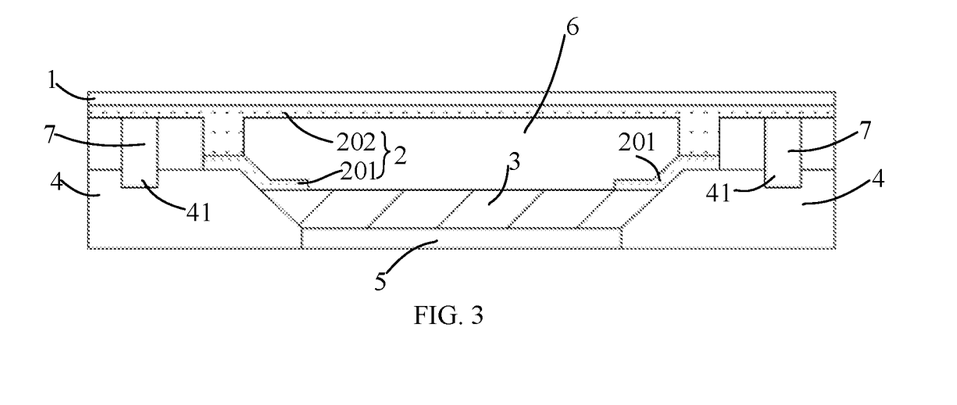
FIG. 3 shows is a structural schematic diagram of a flexible display device according to an embodiment of the present application.

FIG. 3 shows is a structural schematic diagram of a flexible display device according to an embodiment of the present application.

Referring to FIG. 3, in an embodiment, the flexible display device may further include an encapsulation layer 1 superposed on a surface of the cathode electrode layer 2 away from the organic light emitting layer 3. The encapsulation layer 1 is mainly used to prevent water vapor and oxygen from immersing into an organic light emitting device, prevent the failure of the organic light emitting device, thereby prolonging the life of the organic light emitting device.

In an embodiment, the flexible display device may further include: an adhesive material 7 disposed between the cathode electrode layer 2 and the pixel defining layer 4, or an adhesive material 7 disposed between the encapsulating layer 1 and the pixel defining layer 4. A surface of the pixel defining layer 4 on a same side as the cathode electrode layer 2 includes at least one groove 41. The adhesive material 7 may be filled in the at least one groove 41. When the cathode electrode layer 2 may include a region in which the cathode electrode layer 2 covers a part of the pixel defining layer 4 but is not in contact with the pixel defining layer 4, at least one adhesive material 7 may be located between the partial region of the cathode electrode layer 2 and the at least one groove 41; or the at least one adhesive material 7 may also be located between the encapsulation layer 1 and the at least one groove 41, and the at least one adhesive material 7 is not covered by the cathode electrode layer 2. When the cathode electrode layer 2 is a multi-layer electrically connected structure, a good contact connection between the multi layers of the cathode electrode layer 2 can be ensured by providing at least one adhesive material 7. By providing at least one groove 41, the good contact connection between the cathode electrode layer 2 and the pixel defining layer 4 can be further ensured, and the gap between the multi layers of the cathode electrode layer 2 can be avoided, the gap leads to bad contact of the multi layers of the cathode electrode layer 2.

It should be understood that in the present embodiment, the groove may be replaced with a gap, i.e., filling the adhesive material in the gap is also consistent with the inventive concept of the present application.

The present application also provides a method for manufacturing a flexible display device.

Figure 4A:
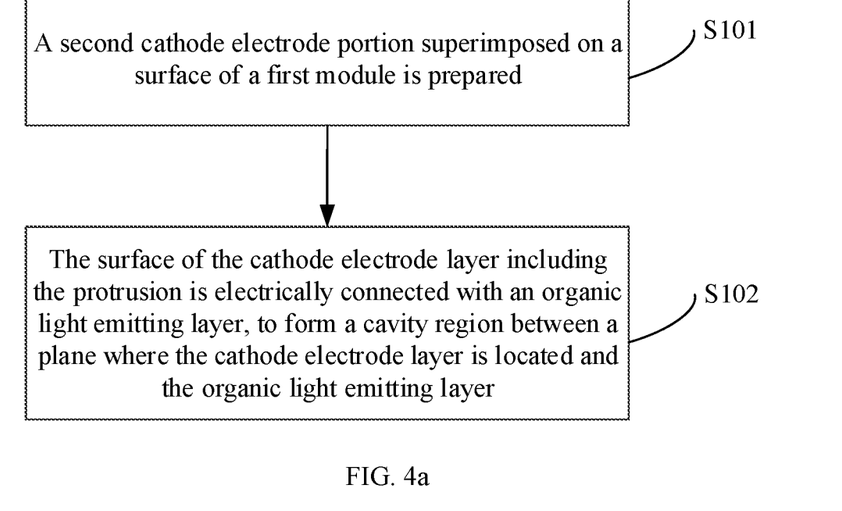
FIG. 4a shows a schematic flow chart of manufacturing a flexible display device according to an embodiment of the present application.

FIG. 4a shows a schematic flow chart of manufacturing a flexible display device according to an embodiment of the present application.

As shown in FIG. 4a, the preparation method may include the following steps.

S101: a second cathode electrode portion 202 superposed on a surface of a first module is prepared. A surface of the cathode electrode layer 2 includes a protrusion 200. The cathode electrode layer 2 may be prepared at one time by a vapor deposition method, and the protrusion 200 is formed on the surface of the cathode electrode layer 2. However, the method for preparing the cathode electrode layer 2 is not specifically limited in the embodiments of the present application.

S102: the surface of the cathode electrode layer 2 including the protrusion 200 is electrically connected with an organic light emitting layer 3, to form a cavity region 6 located between a plane where the cathode electrode layer 2 is located and the organic light emitting layer 3.

Through the above preparing process, the cavity region 6 is formed. When the flexible display device is bent, the cavity region 6 can avoid transmission of bending stress and release the bending stress, thereby effectively preventing stress concentration of the cathode electrode layer 2 and the organic light emitting layer 3, avoiding defects of the cathode electrode layer 2 or the organic light emitting layer 3, such as cracking, peeling and so on, and improving reliability performance of the flexible display device.

The present application also provides a method for manufacturing a flexible display device.

Figure 4B:
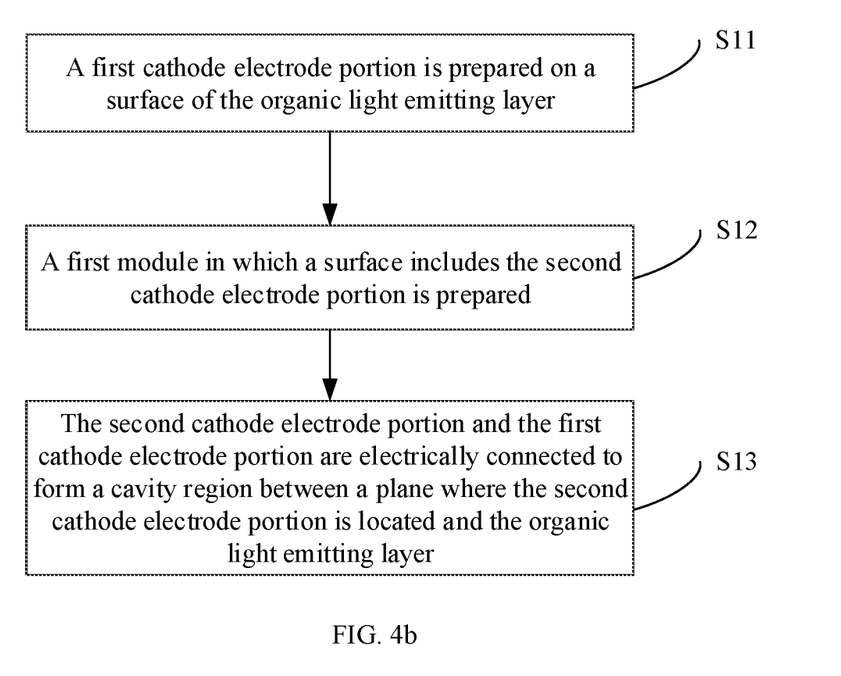
FIG. 4b shows a schematic flow chart of manufacturing a flexible display device according to an embodiment of the present application.

FIG. 4b shows a schematic flow chart of manufacturing a flexible display device according to an embodiment of the present application.

As shown in FIG. 4b, the manufacturing method may include the following steps.

Figure 5:
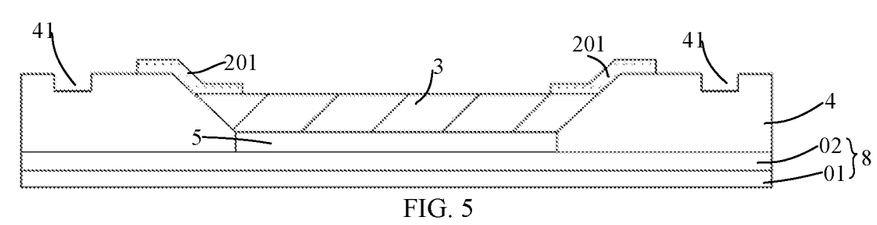
FIG. 5 shows a structural schematic diagram of a flexible display device after preparing a first cathode electrode portion according to an embodiment of the present application.

S11: as shown in FIG. 5, a first cathode electrode portion 201 is prepared on a surface of the organic light emitting layer 3. Compared with the case where the cathode electrode layer 2 is prepared on the organic light emitting layer 3, the preparation of the first cathode electrode portion 201 on the surface of the organic light emitting layer 3 can ensure the firm fitting of the first cathode electrode portion 201 and the organic light emitting layer 3.

The first cathode electrode portion 201 may be prepared on the upper surface of the organic light emitting layer 3 by a vapor deposition method, and a Fine Metal Mask (FMM) may be used for vapor deposition to make the first cathode electrode 201 graphical. The graphical first cathode electrode 201 is located on the surface of the organic light emitting layer 3. In an embodiment, a part of the first cathode electrode portion 201 on the surface of the organic light emitting layer 3 has a width of in a range from 3 to 20 μm. However, the width of the portion may be determined according to a size of sub pixel, which is not specifically limited in the embodiment of the present application. In an embodiment, a thickness of the first cathode electrode portion 201 may be 20 nm, which is not specifically limited in the embodiment of the present application.

Figure 6:
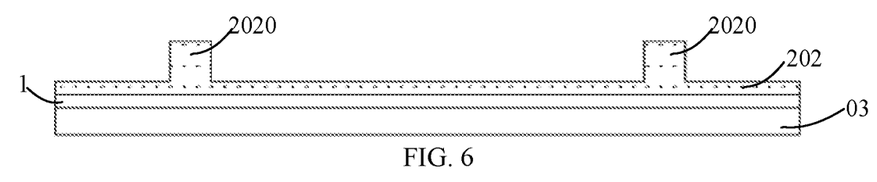
FIG. 6 shows a structural schematic diagram of a flexible display device after preparing a second cathode electrode portion according to an embodiment of the present application.

S12: as shown in FIG. 6, a first module in which a surface includes the second cathode electrode portion 202 is prepared. Similarly to the method of preparing the first cathode electrode portion 201, the second cathode electrode portion 202 may also be prepared by a vapor deposition method, and an FMM may be used for vapor deposition to make the second cathode electrode 202 graphical.

S13: as shown in FIG. 2, the second cathode electrode portion 202 and the first cathode electrode portion 201 are electrically connected to form a cavity region 6 located between a plane where the second cathode electrode portion 202 is located and the organic light emitting layer 3.

The first cathode electrode portion 201 may include a first protrusion (not shown) extending to the second cathode electrode portion 202 and electrically connected with the second cathode electrode portion 202. Or, the first cathode electrode portion 201 is disposed on a surface of the organic light emitting layer 3, and the second cathode electrode portion 202 includes a second protrusion 2020 extending to the first cathode electrode portion 201 and electrically connected with the first cathode electrode portion 201. Or, the first cathode electrode portion 201 is disposed on a surface of the organic light emitting layer 3, the first cathode electrode portion 201 includes a first protrusion extending to the second cathode electrode portion 202, the second cathode electrode portion 202 includes a second protrusion 2020 extending to the first cathode electrode portion 201. The first protrusion of the first cathode electrode portion 201 is electrically connected with the second protrusion 2020 of the second cathode electrode portion 202.

The second cathode electrode 202 and the first cathode electrode 201 may be electrically connected by a splicing process. However, the specific electrical connection manner of the second cathode electrode portion 202 and the first cathode electrode portion 201 is not limited in the embodiments of the present application.

In the embodiments of the present application, the cathode electrode layer 2 is prepared stepwise, i.e., the first cathode electrode portion 201 and the second cathode electrode portion 202 are separately prepared, and then the first cathode electrode portion 201 and the second cathode electrode portion 202 are electrically connected. Through the above-mentioned preparing process, the cavity region 6 is formed. When the flexible display device is bent, the cavity region 6 can avoid transmission of bending stress and release the bending stress, thereby effectively preventing stress concentration of the cathode electrode layer 2 and the organic light emitting layer 3, avoiding defects of the cathode electrode layer 2 or the organic light emitting layer 3, such as cracking, peeling and so on, and improving reliability performance of the flexible display device.

Figure 7:
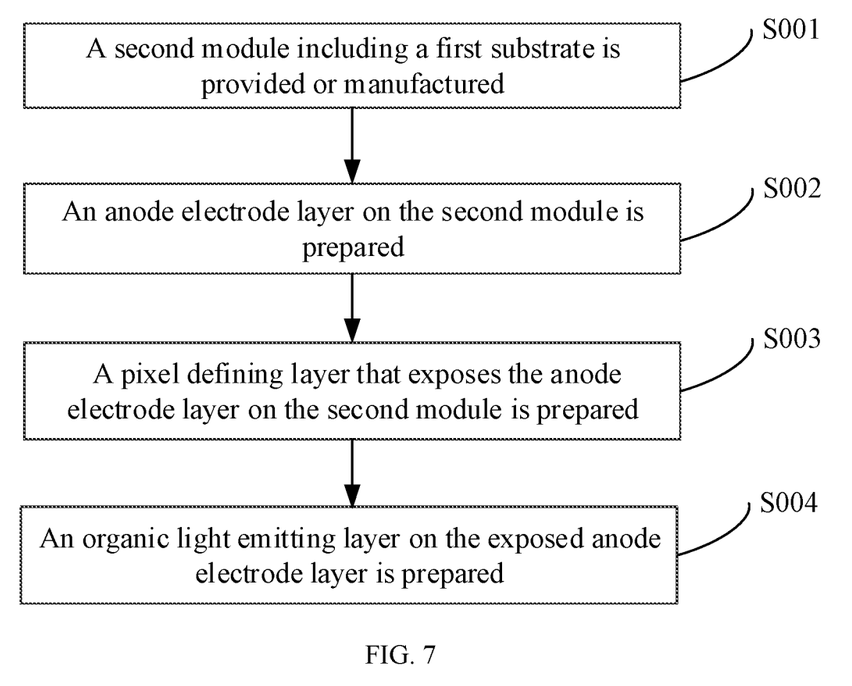
FIG. 7 shows a schematic flow chart of a method for manufacturing a flexible display device before the step of preparing a first cathode electrode portion according to an embodiment of the present application.

FIG. 7 shows a schematic flow chart of a method for manufacturing a flexible display device before the step of preparing a first cathode electrode portion according to an embodiment of the present application.

As shown in FIG. 7, before preparing the first cathode electrode portion on the surface of the organic light emitting layer, the manufacturing method further includes the following steps.

S001: a second module 8 includes a first substrate 01 is provided or manufactured. The first substrate 01 may be a flexible substrate such as a polyimide (PI) substrate, or may be a rigid substrate such as a glass substrate or the like. In order to facilitate to peel off, an embodiment of the present application may adopt a glass substrate, but a type of the first substrate 01 is not specifically limited in the embodiments of the present application. In an embodiment, the second module 8 may further include a backplane 02, and the backplane 02 may be a Thin Film Transistor (TFT) backplane. The TFT backplane has advantages of high responsivity, high contrast, lightness, thinness, low power consumption and the like. However, it should be understood that the specific structural form of the second module 8 is not limited in the embodiments of the present application.

S002: an anode electrode layer 5 on the second module 8 is prepared. Similarly, the anode electrode layer 5 may be prepared by a vapor deposition method. However, the method for preparing the anode electrode layer is not specifically limited in the embodiments of the present application.

S003: a pixel defining layer 4 that exposes the anode electrode layer 5 on the second module 8 is prepared. During the preparing process, a part of the anode electrode layer 5 may be exposed, or all of the anode electrode layer 5 may be exposed such that the anode electrode layer 5 is surrounded by the pixel defining layer 4. However, it should be understood that this is not specifically limited in the embodiments of the present application.

S004: an organic light emitting layer 3 on the exposed anode electrode layer 5 is prepared. The organic light emitting layer 3 may be deposited on the anode electrode layer 5 by a vapor deposition method. Similarly, the method for preparing the organic light emitting layer 3 is not specifically limited in the embodiments of the present application.

Through the above-mentioned steps, the organic light emitting layer 3 may be obtained, and the pixel defining layer 4 surrounds the organic light emitting layer 3. However, it should be understood that the above-mentioned steps are only one embodiment of preparing the organic light emitting layer 3, and the specific method for preparing the organic light emitting layer is not limited in the embodiments of the present application.

In an embodiment, before electrically connecting the second cathode electrode 202 and the first cathode electrode 201, the method may further include the following steps.

An adhesive material 7 on a surface of the pixel defining layer 4 is prepared.

However, it should be understood that the preparing step may also include preparing the adhesive material 7 in a region of the first module corresponding to the pixel defining layer 4. Or the preparing step include preparing the adhesive material 7 on the surface of the pixel defining layer 4, and preparing the adhesive material 7 in a region of the first module corresponding to the pixel defining layer 4. The position of the adhesive material 7 prepared in the embodiment of the present application is not specifically limited in the embodiments of the present application. By preparing the adhesive material 7, the second cathode electrode 202 and the first cathode electrode 201 can be easily electrically connected. The adhesion of the second cathode electrode portion 202 to the first cathode electrode portion 201 is improved. In an embodiment, the adhesive material 7 is a UV adhesive (photosensitive adhesive), and the step may be accomplished by a UV adhesive dispensing process. However, it should be understood that type of the adhesive material 7 is not limited in the embodiments of the present application.

In an embodiment, a surface of the pixel defining layer 4 may include a groove 41. Therefore, before electrically connecting the second cathode electrode portion 202 and the first cathode electrode portion 201, the manufacturing method may further includes the following steps. The adhesive material 7 in the groove 41 on the surface of the pixel defining layer 4 is prepared; and/or, the adhesive material 7 in a region of the first module corresponding to the groove 41 is prepared.

In the embodiment of the present application, at least one adhesive material 7 can be confined in at least one groove 41 by opening at least one groove 41 on the upper surface of the pixel defining layer 4, which can facilitate a good contact connection between the first cathode electrode portion 201 and the second cathode electrode portion 202; and avoid poor contact caused by a gap that occurs when the first cathode electrode portion 201 and the second cathode electrode portion 202 are electrically connected.

However, it should be understood that the opening at least one groove 41 on the upper surface of the pixel defining layer 4 is not a necessary step as long as it can be ensured that the good contact of the electrical connection between the first cathode electrode 201 and the second cathode electrode 202 is achieved and the gap that occurs when the two are electrically connected is avoided by using at least one adhesive material 7.

In an embodiment, after electrically connecting the second cathode electrode portion 202 and the first cathode electrode portion 201, the manufacturing method further includes the step of peeling off the first substrate 01. Because the main function of the first substrate 01 is supporting, the manufacture of the flexible display device is facilitated. The thickness of the flexible display device can be reduced by peeling off the first substrate 01.

Figure 8:
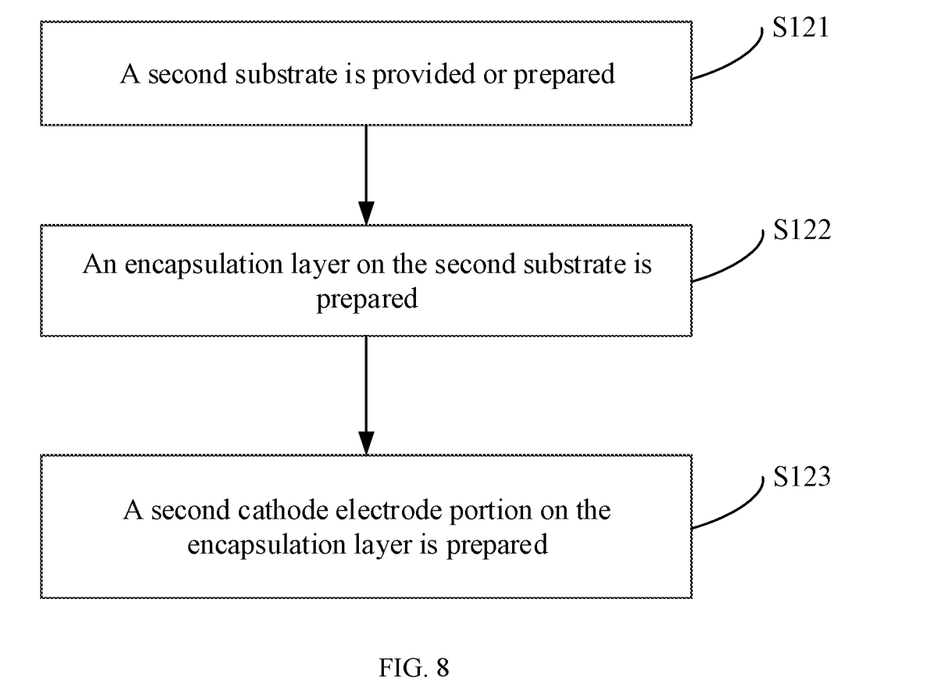
FIG. 8 shows a schematic flow chart of preparing a second cathode electrode portion superposed on a surface of a first module according to an embodiment of the present application.

FIG. 8 is a schematic flow chart of preparing a second cathode electrode portion superposed on a surface of a first module according to an embodiment of the present application.

As shown in FIG. 8, the manufacturing procedure includes the following steps.

S121: a second substrate 03 is provided or prepared. The second substrate 03 may be a flexible substrate such as a polyimide (PI) substrate, or may be a rigid substrate such as a glass substrate or the like. In the embodiment of the present application, the second substrate 03 may adopt a glass substrate in order to facilitate the peeling off, but the type of the second substrate 03 is not specifically limited in the embodiments of the present application.

S122: an encapsulation layer 1 on the second substrate 03 is prepared. The second substrate 03 may be an organic thin film layer, an inorganic thin film layer, or a superposed structure of an inorganic thin film layer and an organic thin film layer. However, it should be understood that the specific structural form of the encapsulation layer 1 is not limited in the embodiments of the present application. The encapsulation layer 1 is mainly used to prevent water vapor and oxygen from immersing into an organic light emitting device and prevent aging of the organic light emitting device, thereby prolonging the life of the organic light emitting device.

S123: a second cathode electrode portion 202 on the encapsulation layer 1 is prepared. The preparation of the second cathode electrode 202 on the encapsulation layer 1 may be performed by a vapor deposition method, which makes the second cathode electrode 202 graphical. However, it should be understood that the method for preparing the second cathode electrode portion 202 is not specifically limited in the embodiments of the present application.

In an embodiment, the second cathode electrode portion 202 includes at least one second protrusion 2020. In an embodiment, a layer thickness of the second cathode electrode portion 202 may be 20 nm, and a width of the second protrusion 2020 is in a range from 3 to 20 μm, but the width of the second protrusion 2020 may be determined according to a size of sub pixel, and the position is disposed corresponding to the first cathode electrode portion 201. However, it should be understood that the layer thickness of the second cathode electrode, the width of the second protrusion 2020, and the position of the second protrusion 2020 are not specifically limited in the embodiments of the present application. However, it should be understood that a first protrusion (not shown) may also be prepared on the first cathode electrode portion 201, and the first cathode electrode portion 201 is electrically connected with the second cathode electrode portion 202 through the first protrusion. However, preparing the first protrusion on the first cathode electrode portion 201 requires adding a film coating process. Therefore, in the present embodiment, it is preferable to prepare the second protrusion 2020 on the second cathode electrode 202, and the second cathode electrode portion 202 is electrically connected with the first cathode electrode portion 201 through the second protrusion 2020 to form at least one opening structure 6. Good electrical connection between the first cathode electrode portion 201 and the second cathode electrode portion 202 is facilitated.

In an embodiment, after electrically connecting the second cathode electrode portion to the first cathode electrode portion, the manufacturing method further includes the step of peeling off the second substrate 03. Because the main function of the second substrate 03 is supporting to facilitate the manufacturing of the flexible display device. The thickness of the flexible display device can be reduced by peeling off the second substrate 03. After the second substrate 03 is peeled off, the encapsulation layer 1 may be exposed. Since the encapsulation layer 1 may include an organic thin film layer such as a PI layer, a TouchPanel (TP) functional layer may be directly prepared on the surface of the PI layer, which saves a PI layer preparation process comparing with the existing TouchPanel (TP) functional layer preparation technology, and also saves a bonding process. Since there is no bonding process, an Optically Clear Adhesive (OCA) layer can be reduced. Therefore, the overall thickness of the flexible display can be reduced, which is beneficial to improve the overall bending resistance of the flexible display device.

It should be understood that the method set forth in this embodiment is also applicable when the associated groove is replaced with a gap corresponding to the structure of the above embodiment.

Furthermore, it should be also understood that, in the method embodiments of the present application, the steps involved in preparing may be the specific implementations of the corresponding steps involved in providing. For example, the step of preparing a cathode electrode layer may be a specific implementation of the step of providing a cathode electrode layer.

The above-mentioned display devices may be applied to mobile devices, computers, tablets, VR, AR and other terminal devices.

It should be understood that the first and second qualifiers mentioned in the embodiments of the present application is merely for the purpose of more clearly describing the technical solutions of the embodiments of the present application and cannot be used to limit the scope of the present application.

The above are only the preferred embodiments of the present application, and are not intended to limit the scope of the present application. Any modifications, equivalent substitutions, improvements and the like made within the spirit and principles of the present application should be included within the scope of the present application.

What is claimed is:

1. A flexible display device, comprising:
   an organic light emitting layer for emitting light;
   a cathode electrode layer disposed on the organic light emitting layer; and
   a cavity region located between a plane where the cathode electrode layer is located and the organic light emitting layer;
   wherein the cathode electrode layer comprises a protrusion extending to the organic light emitting layer and electrically connected with the organic light emitting layer.

2. The flexible display device according to claim 1, wherein the cathode electrode layer comprises a first cathode electrode portion and a second cathode electrode portion, and the first cathode electrode portion and the second cathode electrode portion are superposed;
   the first cathode electrode portion is disposed on a surface of the organic light emitting layer, and the first cathode electrode portion comprises a first protrusion as the protrusion extending to the second cathode electrode portion and electrically connected with the second cathode electrode portion; or, the first cathode electrode portion is disposed on a surface of the organic light emitting layer, and the second cathode electrode portion comprises a second protrusion as the protrusion extending to the first cathode electrode portion and electrically connected with the first cathode electrode portion; or, the first cathode electrode portion is disposed on a surface of the organic light emitting layer, and as the protrusion, the first cathode electrode portion comprises a first protrusion extending to the second cathode electrode portion, the second cathode electrode portion comprises a second protrusion extending to the first cathode electrode portion, and the first protrusion is electrically connected with the second protrusion.

3. The flexible display device according to claim 2, wherein a part of the first cathode electrode portion located on the surface of the organic light emitting layer has a width in range from 3 to 20 μm, and a thickness of the first cathode electrode portion is approximately 20 nm.

4. The flexible display device according to claim 1, further comprising:
   a pixel defining layer surrounding the organic light emitting layer;
   an anode electrode layer disposed on a non-light emitting side of the organic light emitting layer;
   an encapsulating layer superposed on a surface of the cathode electrode layer away from the organic light emitting layer; and
   an adhesive material disposed between the cathode electrode layer and the pixel defining layer or between the encapsulating layer and the pixel defining layer.

5. The flexible display device according to claim 4, wherein the cathode electrode layer comprises a region in partial contact with the pixel defining layer portion.

6. The flexible display device according to claim 4, wherein a surface of the pixel defining layer disposed on a same side as the cathode electrode layer comprises at least one groove or gap, and the adhesive material is filled in the at least one groove or gap.

7. A method of manufacturing a flexible display device of claim 1, comprising:
   providing a cathode electrode layer, a surface of the cathode electrode layer comprising a protrusion; and
   electrically connecting the surface of the cathode electrode layer comprising the protrusion with an organic light emitting layer to form a cavity region located between a plane where the cathode electrode layer is located and the organic light emitting layer.

8. A method of manufacturing a flexible display device, comprising:
   providing a first cathode electrode portion on a surface of an organic light emitting layer; and
   providing a second cathode electrode portion, and electrically connecting the second cathode electrode portion with the first cathode electrode portion to form a cavity region located between a plane where the second cathode electrode portion is located and the organic light emitting layer;
   wherein the first cathode electrode portion comprises a first protrusion for electrically connecting with the second cathode electrode portion; or the second cathode electrode portion comprises a second protrusion for electrically connecting with the first cathode electrode portion; or, the first cathode electrode portion comprises a first protrusion for electrically connecting with the second cathode electrode portion; and the second cathode electrode portion comprises a second protrusion for electrically connecting with the first cathode electrode portion.

9. The manufacturing method according to claim 8, wherein before providing a first cathode electrode portion on a surface of an organic light emitting layer, the manufacturing method further comprises:
   providing a first substrate;
   providing an anode electrode layer;
   providing a pixel defining layer to expose the anode electrode layer; and
   providing the organic light emitting layer on an exposed anode electrode layer.

10. The manufacturing method according to claim 9, wherein a surface of the pixel defining layer comprises a groove or a gap; and
   before electrically connecting the second cathode electrode portion with the first cathode electrode portion, the manufacturing method comprises:
   providing an adhesive material in the groove or the gap.

11. The manufacturing method according to claim 8, wherein before electrically connecting the second cathode electrode portion with the first cathode electrode portion, the manufacturing method further comprises:
   providing an adhesive material on a surface of the pixel defining layer.

12. The manufacturing method according to claim 8, wherein after electrically connecting the second cathode electrode portion with the first cathode electrode portion, the manufacturing method further comprises:
   peeling off the first substrate.

13. The manufacturing method according to claim 8, wherein the preparing a second cathode electrode portion comprises:
   providing or preparing a second substrate;
   providing an encapsulation layer on the second substrate; and
   providing the second cathode electrode portion on the encapsulation layer.

14. The manufacturing method according to claim 8, wherein after electrically connecting the second cathode electrode portion with the first cathode electrode portion, the manufacturing method further comprises:
   peeling off the second substrate.

\* \* \* \* \*